(12) United States Patent
Yeh et al.

(10) Patent No.: US 10,475,962 B2
(45) Date of Patent: Nov. 12, 2019

(54) OPTOELECTRONIC DEVICE

(71) Applicant: EPISTAR CORPORATION, Hsinchu (TW)

(72) Inventors: Tzung-Shiun Yeh, Hsinchu (TW); Li-Ming Chang, Hsinchu (TW); Chien-Fu Shen, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 15/889,888

(22) Filed: Feb. 6, 2018

(65) Prior Publication Data

US 2018/0233629 A1  Aug. 16, 2018

Related U.S. Application Data

(60) Provisional application No. 62/459,102, filed on Feb. 15, 2017.

(51) Int. Cl.
| | |
|---|---|
| *H01L 33/36* | (2010.01) |
| *H01L 33/62* | (2010.01) |
| *H01L 33/38* | (2010.01) |
| H01L 33/14 | (2010.01) |
| H01L 33/20 | (2010.01) |

(52) U.S. Cl.
CPC .............. *H01L 33/36* (2013.01); *H01L 33/38* (2013.01); *H01L 33/62* (2013.01); *H01L 33/14* (2013.01); *H01L 33/20* (2013.01)

(58) Field of Classification Search
None
See application file for complete search history.

(56) References Cited

U.S. PATENT DOCUMENTS

| | | | | |
|---|---|---|---|---|
| 9,530,934 | B1* | 12/2016 | Chou | ................. H01L 33/38 |
| 2012/0228580 | A1* | 9/2012 | Wang | ................. H01L 27/156 |
| | | | | 257/13 |
| 2014/0110741 | A1* | 4/2014 | Ou | .................... H01L 33/36 |
| | | | | 257/99 |
| 2014/0367720 | A1* | 12/2014 | Kim | ................... H01L 33/42 |
| | | | | 257/98 |
| 2017/0040515 | A1* | 2/2017 | Lee | .................... H01L 33/62 |
| 2017/0179343 | A1* | 6/2017 | Chou | ................. H01L 33/38 |

FOREIGN PATENT DOCUMENTS

TW          200715604 A       4/2007

* cited by examiner

*Primary Examiner* — Lex H Malsawma
(74) *Attorney, Agent, or Firm* — Patterson + Sheridan, LLP

(57) ABSTRACT

An optoelectronic device includes a substrate; a semiconductor stack, formed on the substrate; a current blocking region, formed above the semiconductor stack and comprising a first pad portion and a first finger portion; a first opening, formed in the first pad portion, wherein in a top view, the first opening comprises an elongated shape defined by the first pad portion; a transparent conductive layer formed on the current blocking region and/or a surface of the semiconductor stack; and a first electrode formed above the current blocking region; wherein the transparent conductive layer comprises a second opening to expose the first opening, and the first electrode electrically connects the semiconductor stack through the first opening and the second opening.

18 Claims, 11 Drawing Sheets

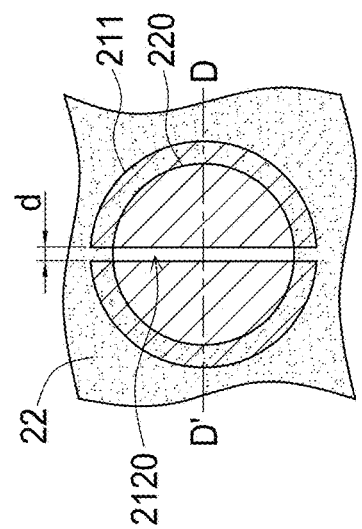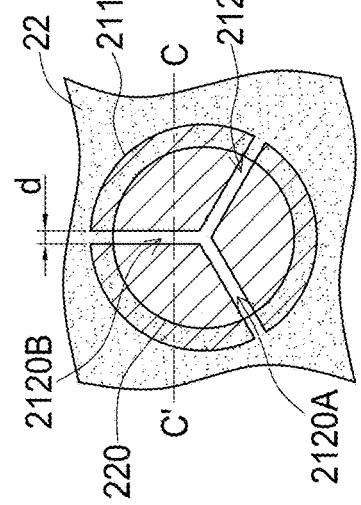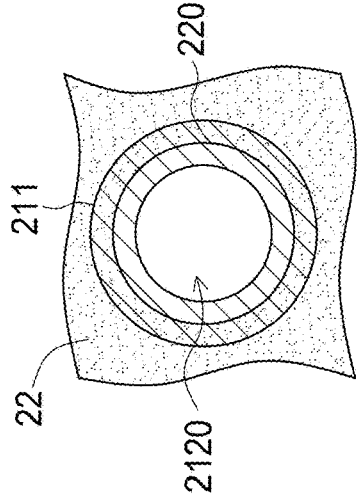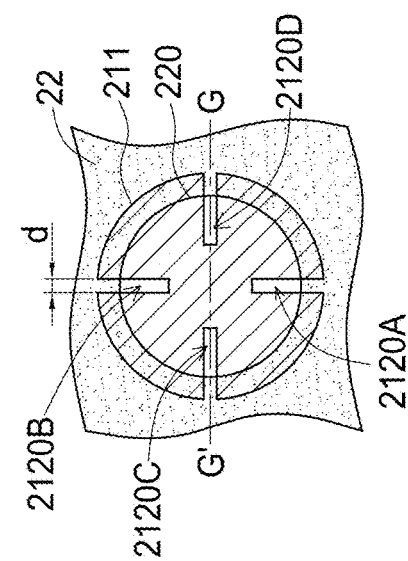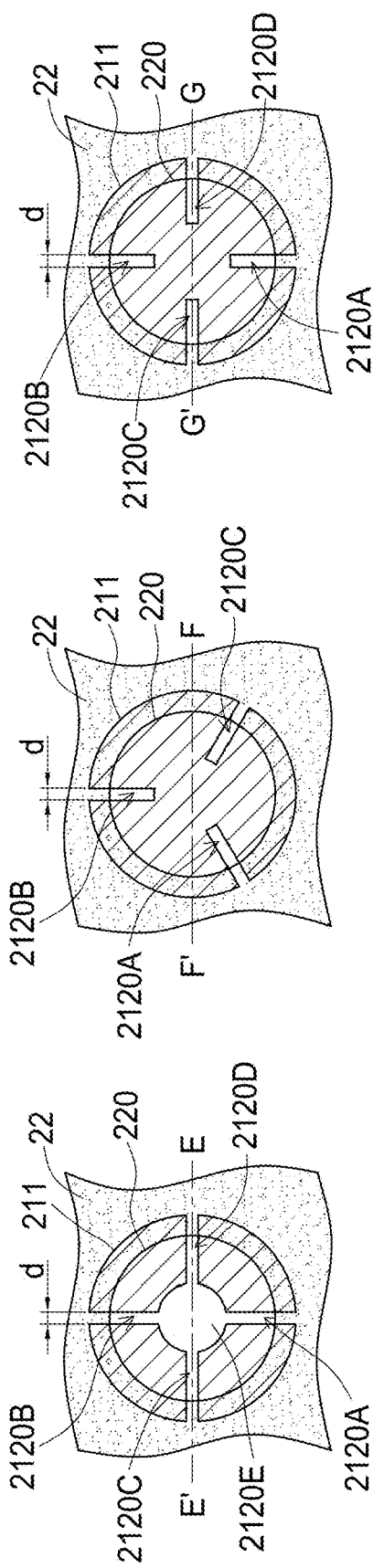

| Type | Design of the Pad Portion | Ratio of the area A2 to the total area A3(%) | Operating Voltage(V) | Power(mW) | Peeling test | OM image of the first pad electrode after Peeling Test |
|---|---|---|---|---|---|---|
| I |  | 0 | 2.86 | 44.03 | Fail |  |
| II |  | 38.6 | 2.85 | 43.52 | Pass |  |
| III |  | 19.6 | 2.86 | 43.96 | Pass |  |

OPTOELECTRONIC DEVICE

CROSS-REFERENCE TO RELATED APPLICATIONS

This application claims priority to and the benefit of U.S. provisional application No. 62/459,102 filed on Feb. 15, 2017. The entire disclosure of U.S. provisional application No. 62/459,102 is hereby incorporated herein by reference.

BACKGROUND OF INVENTION

1. Field of the Invention

The present disclosure relates to an optoelectronic device, more particularly, to a light-emitting device with uniform current spreading and improved brightness.

2. Description of the Related Art

The light-emitting diodes (LEDs) of the solid-state lighting elements have the characteristics of low power consumption, low heat generation, long operation life, crash proof, small volume, quick response and good opto-electrical property like light emission with a stable wavelength, so the LEDs have been widely used in household appliances, indicator light of instruments, and opto-electrical products, etc. As the opto-electrical technology develops, the solid-state lighting elements have great progress in the light efficiency, operation life and the brightness, and LEDs are expected to become the main stream of the lighting devices in the near future.

A conventional LED basically includes a substrate, an n-type semiconductor layer, an active layer and a p-type semiconductor layer formed on the substrate, and p, n-electrodes respectively formed on the p-type, n-type semiconductor layers. When imposing a certain level of operating voltage to the LED via the electrodes, holes from the p-type semiconductor layer and electrons from the n-type semiconductor layer are combined in the active layer to release light. The improvements of the brightness and the operating voltage are important subjects of the LED.

SUMMARY OF THE INVENTION

An optoelectronic device includes a substrate; a semiconductor stack, formed on the substrate; a current blocking region, formed above the semiconductor stack and comprising a first pad portion and a first finger portion; a first opening, formed in the first pad portion and comprising an elongate shape; and a first electrode formed above the current blocking region and electrically connecting to the semiconductor stack through the first opening.

BRIEF DESCRIPTION OF THE DRAWINGS

FIGS. 1A-1C show an optoelectronic device in accordance with one embodiment of the present disclosure;

FIGS. 2A-2H respectively show a top view of a current blocking region, viewed through an opening of a transparent conductive layer, in accordance with different embodiments of the present disclosure;

DETAILED DESCRIPTION OF THE PREFERRED EMBODIMENTS

To better and concisely explain the disclosure, the same name or the same reference number given or appeared in different paragraphs or figures along the specification should has the same or equivalent meanings while it is once defined anywhere of the disclosure.

Throughout the description, the substrate according to the disclosure is regarded as being placed horizontally. The stack of thin layers is formed above the substrate. The meaning of the expressions "above" and "below", "on" and "under" or "lower" and "upper" is to be considered with respect to this orientation. If not specifically stipulated, the expressions "above" and "below" or "on" and "under" do not necessarily mean that two layers are positioned in contact with one another. Furthermore, the meaning of the expression "layer" is a region of material having a thickness and the composition of which is chosen to provide desired properties. If not specifically stipulated, the expressions "layer" can mean a single layer or include multiple sub-layers.

Though the optoelectronic device disclosed in the present disclosure includes a light-emitting diode. Optoelectronic devices such as laser diode, solar cell, light-sensor etc. are within the scope of the present disclosure. The following embodiments, alone or combinations thereof, all are in the scope of the present disclosure. The embodiments of the present disclosure will be described below with referring to the accompanying drawings.

Figure 1A:
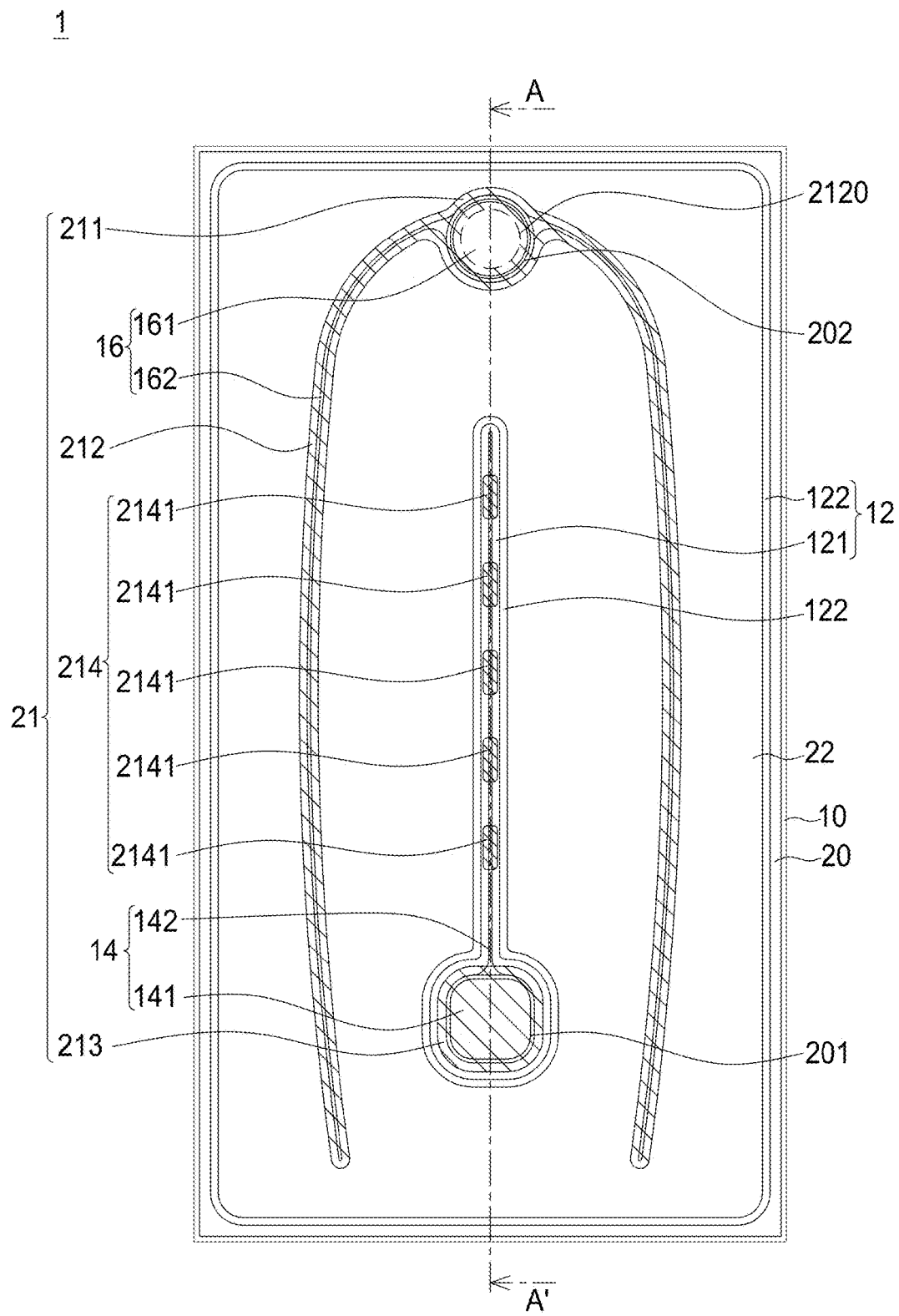
Figure 1B:
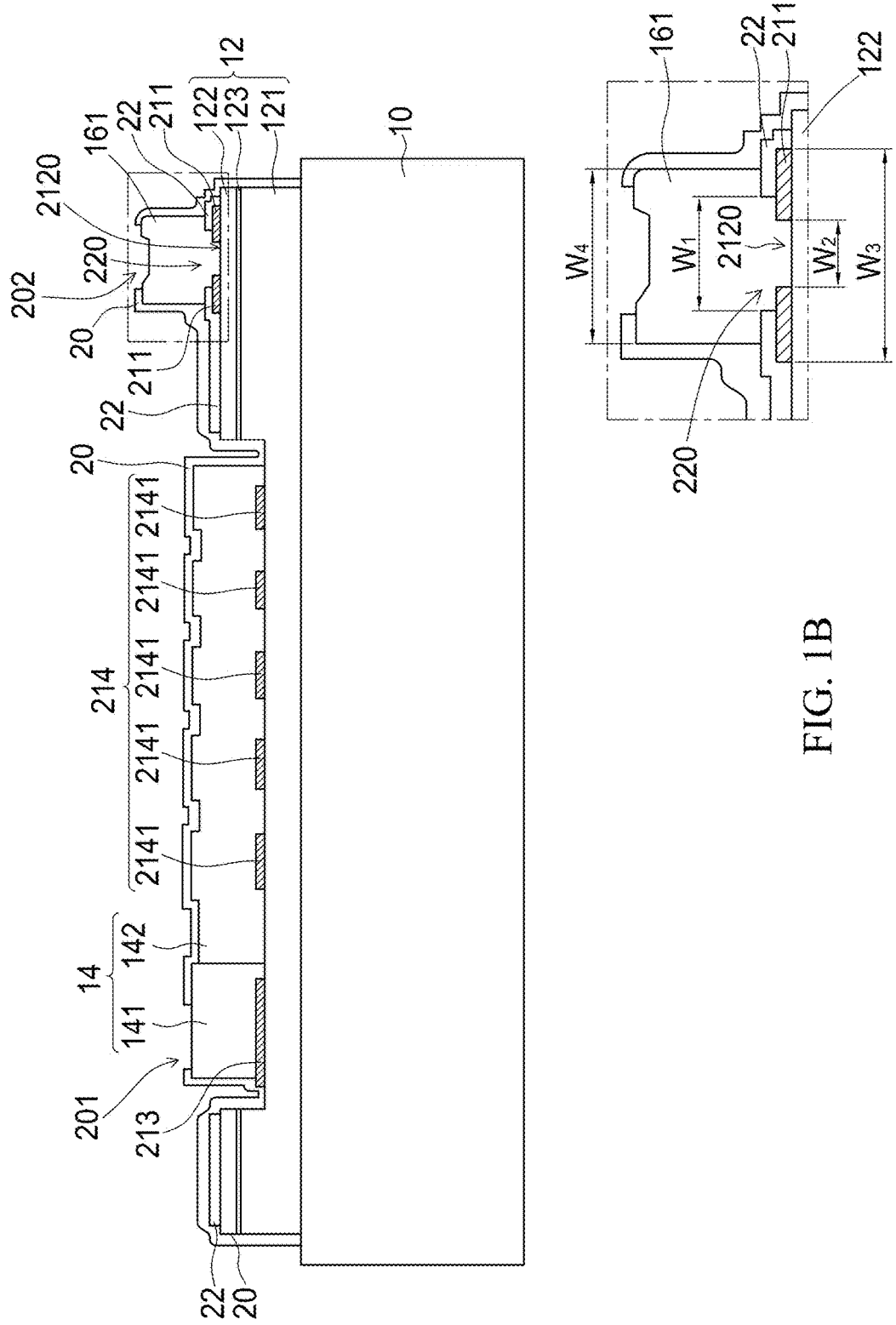

FIG. 1A shows a top view of an optoelectronic device 1 in accordance with a first embodiment of the present disclosure. FIG. 1B shows a cross-sectional view of the optoelectronic device 1 taken along line A-A' of FIG. 1A.

Referring to FIGS. 1A and 1B, the optoelectronic device 1 includes a substrate 10, a semiconductor stack 12 on the substrate 10, a current blocking region 21 on the semiconductor stack 12, a transparent conductive layer 22 on the semiconductor stack 12, a first electrode 16, a second electrode 14, and a protective layer 20. The second electrode 14 includes a second pad electrode 141 and a second finger electrode 142 extending therefrom. The first electrode 16 includes a first pad electrode 161 and two first finger electrodes 162 extending therefrom. The protective layer 20 includes openings 201 and 202 to expose the second pad electrode 141 and the first pad electrode 161. The number of the finger electrodes of the first electrode 16 and the second electrode 14 is not limited to the mentioned above, and can be designed in accordance with the characteristics of the optoelectronic device, such as the size, the quality of the semiconductor stack, the and optical-electrical characteristic of the optoelectronic device, for example the brightness or the current spreading.

In the top view shown in FIG. 1A, the second finger electrode 142 extends from the second pad electrode 141 and towards the first pad electrode 161. In one embodiment, the second finger electrode 142 extends along a direction towards one shorter edge of the optoelectronic device 1 opposite to the second pad electrode 141. In on embodiment, the second finger electrode 142 is parallel to a longer edge of the optoelectronic device 1. The first finger electrodes 162 extend from the first pad electrode 161 and towards the second pad electrode 141. In one embodiment, the first finger electrode 162 extends along a direction towards another one shorter edge of the optoelectronic device 1 opposite to the first pad electrode 161. In on embodiment, the first finger electrode 162 is parallel to the longer edge of the optoelectronic device 1. In the embodiment, the second electrode 14 and the first electrode 16 are formed on the same side of the substrate 10. In another embodiment, the second electrode 14 and the first electrode 16 can be formed on opposite sides of the substrate 10, and the current blocking region 21 can be correspondingly formed under the second electrode 14 and the first electrode 16.

Referring to FIG. 1B, the substrate 10 can be a growth substrate, including gallium arsenide (GaAs) wafer for growing aluminum gallium indium phosphide (AlGaInP) wafer, sapphire ($Al_2O_3$) wafer, gallium nitride (GaN) wafer, silicon carbide (SiC) wafer, or aluminum nitride (AlN) wafer for growing indium gallium nitride (InGaN) or aluminum gallium nitride (AlGaN). The substrate 10 can be a patterned substrate; i.e. the upper surface of the substrate 10 on which the semiconductor stack 12 is epitaxial grown can include a patterned structure. Lights emitted from the semiconductor stack 12 can be refracted by the patterned structure of the substrate 10 so that the brightness of the optoelectronic device is improved. Furthermore, the patterned structure retards or restrains the dislocation due to lattice mismatch between the substrate 10 and the semiconductor stack 12 so that the epitaxy quality of the semiconductor stack 12 is improved.

In an embodiment of the present disclosure, the semiconductor stack 12 can be formed on the substrate 10 by organic metal chemical vapor deposition (MOCVD), molecular beam epitaxy (MBE), hydride vapor deposition (HVPE), or ion plating, such as sputtering or evaporation.

The semiconductor stack 12 includes a first semiconductor layer 121, an active layer 123 and a second semiconductor layer 122 sequentially formed on the substrate 10. In an embodiment of the present disclosure the first semiconductor layer 121 and the second semiconductor layer 122, such as a cladding layer or a confinement layer, have different conductivity types, electrical properties, polarities, or doping elements for providing electrons or holes. For example, the first semiconductor layer 121 is an n-type semiconductor, and the second semiconductor layer 122 is a p-type semiconductor. The active layer 123 is formed between the first semiconductor layer 121 and the second semiconductor layer 122. The electrons and holes combine in the active layer 123 under a current driving to convert electric energy into light energy to emit light. The wavelength of the light emitted from the optoelectronic device 1 or the semiconductor stack 12 is adjusted by changing the physical and chemical composition of one or more layers in the semiconductor stack 12.

The material of the semiconductor stack 12 includes a group III-V semiconductor material, such as $Al_xIn_yGa_{(1-x-y)}N$ or $Al_xIn_yGa_{(1-x-y)}P$, wherein $0 \leq x$, $y \leq 1$; $(x+y) \leq 1$. According to the material of the active layer 123, when the material of the semiconductor stack 12 is AlInGaP series material, red light having a wavelength between 610 nm and 650 nm or yellow light having a wavelength between 550 nm and 570 nm can be emitted. When the material of the semiconductor stack 12 is InGaN series material, blue or deep blue light having a wavelength between 400 nm and 490 nm or green light having a wavelength between 490 nm and 550 nm can be emitted. When the material of the semiconductor stack 12 is AlGaN series material, UV light having a wavelength between 400 nm and 250 nm can be emitted. The active layer 123 can be a single heterostructure (SH), a double heterostructure (DH), a double-side double heterostructure (DDH), or a multi-quantum well structure (MQW). The material of the active layer can be i-type, p-type, or n-type semiconductor.

Besides, a buffer layer (not shown) is formed on the upper surface of the substrate 10 before forming the semiconductor stack 12. The buffer layer can also reduce the lattice mismatch described above and restrain the dislocation so as to improve the epitaxy quality. The material of the buffer layer includes GaN, AlGaN or MN. In one embodiment, the buffer layer includes a plurality of sub-layers (not shown). The sub-layers include the same material or different material. In one embodiment, the buffer layer includes two sub-layers. The sub-layers include same material MN. The growth method of the first sub-layer is sputtering, and the growth method of the second sub-layer is MOCVD. In one embodiment the buffer layer further includes a third sub-layer. The growth method of the third sub-layers is MOCVD, and the growth temperature of the second sub-layer is higher than or lower than that of the third sub-layer.

As shown in FIG. 1B, an exposed region is formed by etching and removing parts of the second semiconductor layer 122 and the active layer 123 downward to an upper surface of the first semiconductor layer 121. At the exposed region, side surfaces of the second semiconductor layer 122 and the active layer 123 and the upper surface of the first semiconductor layer 121 are exposed. The second electrode 14 is disposed on the exposed upper surface of the first semiconductor layer 121 and forms an electrical connection with the first semiconductor layer 121. The first electrode 16 is disposed on the second semiconductor layer 122 and forms an electrical connection with the second semiconductor layer 122.

The material of the second pad electrode 141, the second finger electrode 142, the first pad electrode 161 and the first finger electrodes 162 are selected from metal, such as Au, Ag, Cu, Cr, Al, Pt, Ni, Ti, Sn, Rh, alloy or stacked composition of the materials described above.

The current blocking region 21 is correspondingly formed under the second electrode 14 and the first electrode 16 and on the first semiconductor layer 121 and the second semiconductor layer 122. In the embodiment, the current blocking region 21 including a first pad portion 211, a first finger portion 212, a second pad portion 213 and a second finger portion 214. The second pad portion 213 and the second finger portion 214 are correspondingly and respectively formed under the second pad electrode 141 and the second finger electrodes 142 and on the first semiconductor layer 121. The first pad portion 211 and the first finger portion 212 are correspondingly and respectively formed under the first pad electrode 161 and the first finger electrodes 162 and on the second semiconductor layer 122. When current (electron or hole) is injected into the optoelectronic device 1 via the second pad electrode 141 and the first pad electrode 161, the current is spread via the second finger electrode 142 and the first finger electrode 162, and then flows into the first semiconductor layer 121 and the second semiconductor layer 122. The current blocking region 21 prevents most parts of the current from directly flowing into the active layer 123 under the electrodes to avoid the current crowding issue.

In the embodiment, as shown in FIGS. 1A and 1B, the first pad portion 211 of the current blocking region 21 is formed under the first pad electrode 161, and the first finger portion 212 of the current blocking region 21 extends from the first pad portion 211 and is formed under the first finger electrodes 162. At the region of the first pad electrode 161, most part or all of the current is blocked from flowing downward via the first pad portion 211, and then the current is spread via the transparent conductive layer 22 and the first finger electrodes 162. At the regions of the first finger electrodes 162, the current is blocked from flowing downward by the first finger portion 212. The current is spread laterally in the transparent conductive layer 22 and then uniformly flows into the second semiconductor layer 122. Furthermore, the second pad portion 213 of the current blocking region 21 is formed under the second pad electrode 141, and the second finger portion 214 of the current blocking region 21 includes a plurality of separated islands 2141 under the second finger electrode 142. The current, spread in the second finger electrode 142, is blocked from flowing downward at the regions where the plurality of separated islands 2141 is located. The current flows downward and into the first semiconductor layer 121 through regions of the second finger electrode 142 between two adjacent islands 2141. The second finger electrode 142 contacts the first semiconductor layer 121 at the regions between each two adjacent separated islands 2141, and multiple contact regions with low contact resistance are formed between the regions of the second finger electrode 142 and the first semiconductor layer 121. The current can flow into the first semiconductor layer 121 from the second finger electrode 142 via the contact regions.

The material of the current blocking region 21 comprises transparent insulated material, such as silicon oxide, silicon nitride, silicon oxynitride, titanium oxide or aluminum oxide. The structure of the current blocking region 21 can be a single layer or alternately multiple layers, such as DBR (distributed Bragg reflector). The thickness of the current blocking region 21 ranges from 700-5000 Å. In one embodiment, the thickness of the current blocking region 21 ranges from 700-1000 Å. In another embodiment, the thickness of the current blocking region 21 ranges from 1000-5000 Å.

The transparent conductive layer 22 is formed on the current blocking region 21 and/or the surface of the second semiconductor layer 122, such that the current injected into the first electrode 16 can be spread uniformly by the transparent conductive layer 22, and then flow into the second semiconductor layer 122. Because the transparent conductive layer 22 is disposed on the light extraction side of the optoelectronic device 1, an electrically-conducting material that has transparent property is preferable to be selected. More specifically, the transparent conductive layer 22 may include a thin metal film or a metal oxide structure. The material of the thin metal film includes Ni or Au. The material of the metal oxide structure includes at least one element selected from zinc, indium, or tin, such as ZnO, InO, SnO, indium tin oxide (ITO), indium zinc oxide (IZO), or gallium-doped zinc oxide (GZO). The transparent conductive layer 22 has a high optical transmissivity, such as 60%, 70%, 75%, and 80% or higher, of light emitted from the active layer 123, and a high electrical conductivity.

Referring to FIGS. 1B to 1C, FIG. 1C shows a partial top view of the first pad portion 211 of the current blocking region 21, an opening 2120, the transparent conductive layer 22, and an opening 220 of the optoelectronic device 1 in accordance with the embodiment of the present disclosure. The opening 2120 is formed in the first pad portion 211 to expose an upper surface of the second semiconductor layer 122. The transparent conductive layer 22 overlays a portion of the first pad portion 211 of the current blocking region 21 and includes the opening 220 corresponding to the location of the first pad electrode 161 to expose the opening 2120 formed in the first pad portion 211 and the upper surface of the second semiconductor layer 122. In one embodiment, the opening 220 can further expose a top surface of the first pad portion 211. As shown in FIG. 1C, the shapes of each two of the first pad portion 211, the opening 2120 and opening 220 are substantially the same. In one embodiment, the shapes of the first pad portion 211, the opening 2120 and the opening 220 are substantially the same. In one embodiment, the shapes of the first pad portion 211, the opening 2120 and the opening 220 are circular and each of them has a common circle center, but not limited thereto. In one embodiment, the shapes of each two of the first pad portion 211, the opening 2120 and the opening 220 are different. In one embodiment, the shape of the first pad portion 211 is rectangular, but the shapes of the opening 2120 and opening 220 are circular.

In one embodiment, the first pad electrode 161 electrically contacts, such as directly contacts the upper surface of the second semiconductor layer 122 through the opening 2120, and a contact region exists therebetween. The contact region between the first pad electrode 161 and the second semiconductor layer 122 includes a contact resistance higher than a contact resistance between the first pad electrode 161 and the transparent conductive layer 22. The contact region between the first pad electrode 161 and the second semiconductor layer 122 is a kind of blocking region between the first pad electrode 161 and the second semiconductor layer 122 to prevent current from flowing into or decrease current flowing into the second semiconductor layer 122 at the opening 2120 and under the first pad electrode 161.

As a cross-section view shown in FIG. 1B, the transparent conductive layer 22 covers a side surface and a partial top surface of the first pad portion 211. A width W1 of the opening 220 of the transparent conductive layer 22 is larger than a width W2 of the opening 2120 formed in the first pad portion 211 but smaller than an outer-edge width W3 of the first pad portion 211, which is a largest distance between two outmost edges of the first pad portion 211 in the cross sectional view. In the situation, a portion of the first pad portion 211 is exposed by the opening 220. In another embodiment, the width W1 of the opening 220 of the transparent conductive layer 22 is the same as or larger than the outer-edge width W3 of the first pad portion 211 to expose the entire of the first pad portion 211. In the situation that the width W1 of the opening 220 of the transparent conductive layer 22 is larger than the outer-edge width W3 of the first pad portion 211, a periphery of the opening 220 is spaced apart from the outmost edge of the first pad portion 211. In other words, the transparent conductive layer 22 does not contact the first pad portion 211.

The first pad electrode 161 is formed on the first pad portion 211 of the current blocking region 21, fills into the openings 2120, 220 and then contacts the exposed upper surface of the second semiconductor layer 122. In one embodiment, the first pad electrode 161 is formed on the transparent conductive layer 22, contacts the transparent conductive layer 22 and the first pad portion 211, and covers the openings 220 and 2120. As shown in the cross sectional view of FIG. 1B, an width W4 of the first pad electrode 161 is a largest distance between two outmost edges of the first pad electrode 161. In the embodiment, the width W4 is larger than the width W1 of the opening 220 and the width W2 of the opening 2120 formed in the first pad portion 211, but smaller than the outer-edge width W3 of the first pad portion 211. In another embodiment, the first pad electrode 161 is formed in the opening 220, only covers the opening 2120 and is spaced apart from the transparent conductive layer 22. The width W4 of the first pad electrode 161 is smaller than the width W1 of the opening 220 and the outer-edge width W3 of the first pad portion 211, but is larger than the width W2 of the opening 2120 formed in the first pad portion 211. In other words, the first pad electrode 161 contacts the first pad portion 211 but does not contact the transparent conductive layer 22.

Adhesion between the first electrode 16 and the second semiconductor layer 122 is larger than that between the first electrode 16 and the current blocking region 21. The adhesion between the first electrode 16 and the current blocking region 21 is larger than that between the first electrode 16 and the transparent conductive layer 22. So the adhesion between the first electrode 16 and the second semiconductor layer 122 dominates the adhesion between the first electrode 16 and parts in contact with the first electrode 16 of the optoelectronic device 1. In the region of the first pad electrode 161, the second semiconductor layer 122 can be exposed by the opening 2120. The larger area of the second semiconductor layer 122 is exposed by the opening 2120, the larger contact area between the first pad electrode 161 and the second semiconductor layer 122 exists, and then the total adhesion between the first pad electrode 161 and parts of the optoelectronic device 1 in contact with the first pad electrode 161 can be increased. Therefore, the first pad electrode 161 can be prevented from peeling and the reliability of the optoelectronic device 1 can be enhanced.

The current blocking region 21 can avoid current crowding to get higher brightness and power of the optoelectronic device 1. The area of the current blocking region 21 affects the current blocking efficiency. The current blocking region 21 also can enhance the light extraction efficiency caused by a refraction difference between the semiconductor stack 12 and the current blocking region 21. However the more area of current blocking region 21 exist between the electrodes 14, 16, and the semiconductor stack 12, the higher operating voltage that the optoelectronic device 1 has. Furthermore, in the region of the first pad portion 211, the adhesion of the first pad electrode 161 is also affected depending on the area of the second semiconductor layer 122 exposed by the opening 2120. So the areas of the opening 2120 and the first pad portion 211 can be adjusted to satisfy the reliability, the brightness, and the operating voltage requirements of the optoelectronic device 1.

FIGS. 2A-2H respectively show the partial top views of the first pad portion 211, the opening 2120, the transparent conductive layer 22 and the opening 220 of the optoelectronic devices in accordance with different embodiments of the present disclosure. In each embodiment, the opening 2120 includes an elongated shape. In one embodiment, the opening 2120 is formed in and extends in the first pad portion 211 so that the first pad portion 211 is separated into several portions by the opening 2120. A contour composed by the outmost edges of the portions of the first pad portion 211 and pseudo edges of the opening extending from each one of the outmost edges and connecting to adjacent one the outmost edges of the portions of the first pad portion 211 includes a composed shape, such as circle, or polygon. The polygon includes triangle, rectangle, etc. In one embodiment, from a top view of the composed shape, two virtual orthogonal straight lines, respectively connecting any two opposite points on the contour of the shape, intersect at a virtual point and have equal distance respectively from the virtual point to the two points on the contour. The virtual point is a center of the composed shape.

As shown in FIGS. 2A-2G, from a top view, the shape of the opening 220 of the transparent conductive layer 22 and the composed shape composed by the first pad portion 211 and the opening 2120 are similar, such as circle or rectangle. In one embodiment, the shape of the first pad electrode 161 formed on the opening 220 of the transparent conductive layer 22 as shown in FIG. 1A is similar to the shape of the opening 220 and the composed shape composed by the first pad portion 211 and the opening 2120. The shapes of the opening 220 and the composed shape composed by the first pad portion 211 and the opening 2120 are not limited to the mentioned above. In one embodiment, the shape of the opening 220, the composed shape composed by the first pad portion 211 and the opening 2120, and the shape of the first pad electrode 161 can be different. In the embodiment as shown in FIG. 2H, the opening 220 of the transparent conductive layer 22 has a circular shape and the composed shape composed by the first pad portion 211 and the opening 2120 is a rectangular shape or a rectangle with curve corners. The shape of the first pad electrode 161 can be a circle. Details will be described below.

Figure 2H:
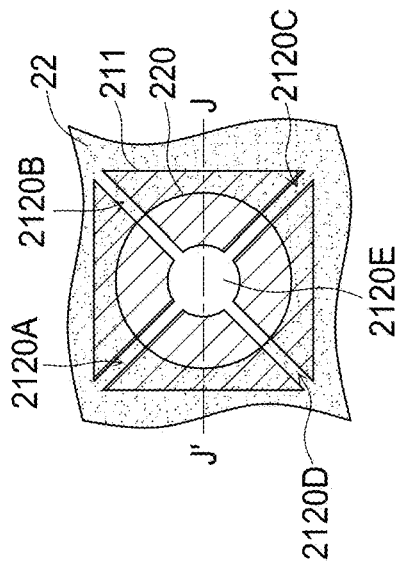
Figure 3A:
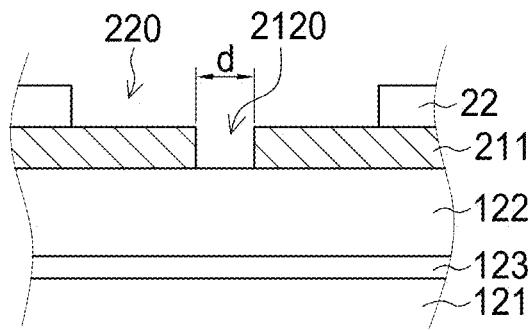
FIGS. 3A-3E respectively show a partial cross sectional view of a current blocking region and a transparent conductive layer in accordance with different embodiments of the present disclosure.

As shown in FIG. 2A, the opening 2120 formed in the first pad portion 211 includes opening branches 2120A, 2120B and 2120C to expose a surface of the second semiconductor layer 122 (not shown). Each of the opening branches 2120A, 2120B and 2120C is elongated. One end of each of the opening branches 2120A, 2120B and 2120C joins at a center of the opening 220 and/or the composed shape of the first pad portion 211 and the opening 2120 with others, and the opening branches 2120A, 2120B and 2120C extend from the ends toward the outmost edge of the first pad portion 211 respectively. Each of the opening branches 2120A, 2120B and 2120C has a width d respectively. The widths d of the opening branches 2120A, 2120B and 2120C are the same or different. In one embodiment, each width d is smaller than or equal to 10 μm. The enlarged cross sectional view of the first pad portion 211, the transparent conductive layer 22, the opening 2120 and the opening 220 taken along line C-C' of FIG. 2A is shown in FIG. 3A. As shown in FIG. 2A, the transparent conductive layer 22 covers a portion of the first pad portion 211, fills into the opening branches 2120A, 2120B and/or 2120C and has an opening 220 to expose portions of the first pad portion 211 and the opening branches 2120A-2120C. In the embodiment, the other end of each of the opening branches 2120A, 2120B and 2120C at the pseudo edges can be aligned with the outmost edge of the first pad portion 211. In other words, the opening branches 2120A, 2120B, 2120C are not closed, and the opening branches 2120A, 2120B, 2120C divide the first pad portion 211 into three portions. In one embodiment, the three portions can have the same area or different area. The area A1 of the first pad portion 211 is the sum of the areas of the three portions. The area A2 of the opening 2120 is the sum of the areas of the opening branches 2120A, 2120B, 2120C. The total area A3 is the sum of the area A1 of the first pad portion 211 and the area A2 of the opening 2120. In the embodiment, a ratio of the area A2 of the opening 2120 to the total area A3 is substantially between 1% and 80%. In one embodiment, the ratio of the area A2 of the opening 2120 to the total area A3 is between 10 and 40%.

As shown in FIG. 2B, the opening 2120 formed in the first pad portion 211 includes an elongated shape. In the embodiment, from a top view, the opening 2120 includes a straight trench passing through the center of the opening 220 and/or a center of the composed shape of the first pad portion 211 and the opening 2120 to expose the surface of the second semiconductor layer 122 (not shown). In one embodiment, the straight trench does not pass through the center of the opening 220 and/or the center of the composed shape of the first pad portion 211 and the opening 2120. In one embodiment, the opening 2120 can have a width d smaller than or equal to 10 μm. The enlarged cross sectional view of the first pad portion 211, the transparent conductive layer 22, the opening 2120 and the opening 220 of the transparent conductive layer 22 taken along line D-D' of FIG. 2B is shown in FIG. 3A. As shown in FIG. 2B, the transparent conductive layer 22 covers a portion of the first pad portion 211, fills into the opening 2120 and has an opening 220 to expose portions of the first pad portion 211 and the opening 2120. In the embodiment, the two ends of the opening 2120 at the pseudo edges can be aligned with the outmost edge of the first pad portion 211. In other words, the opening 2120 is not closed and divides the first pad portion 211 into two portions. In the embodiment, similar to the description in the embodiment shown in FIG. 2A, the area A1 of the first pad portion 211 is the sum of the areas of the two portions. The total area A3 is the sum of the area A1 of the first pad portion 211 and the area A2 of the opening 2120. A ratio of the area A2 of the opening 2120 to the total area A3 is substantially between 1% and 80%. In one embodiment, the ratio of the area A2 of the opening 2120 to the total area A3 is between 10 and 40%.

Figure 3B:
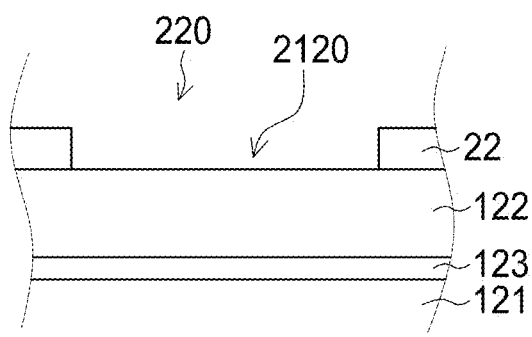

As shown in FIG. 2C, the opening 2120 formed in the first pad portion 211 includes opening branches 2120A, 2120B, 2120C and 2120D and an opening region 2120E at the center of the composed shape of the first pad portion 211 and the opening 2120 to expose the surface of the second semiconductor layer 122 (not shown). Each of the opening branches 2120A, 2120B, 2120C and 2120D is elongated. One end of each of the opening branches 2120A, 2120B, 2120C and 2120D is connected to the opening region 2120E. The opening branches 2120A, 2120B 2120C and 2120D extend from the one ends connected to the opening region 2120E toward the outmost edge of the first pad portion 211 respectively. In one embodiment, each of the opening branches 2120A, 2120B, 2120C and 2120D has a width d respectively. The widths d of the opening branches 2120A, 2120B, 2120C and 2120D are the same or different. Each width d is smaller than or equal to 10 μm. The enlarged cross sectional view of the first pad portion 211, the transparent conductive layer 22, the opening 2120 and the opening 220 of the transparent conductive layer 22 taken along line E-E' of FIG. 2C is shown in FIG. 3B. As shown in FIG. 2C, the transparent conductive layer 22 covers a portion of the first pad portion 211, and fills into the opening branches 2120A, 2120B, 2120C, and/or 2120D. The transparent conductive layer 22 has an opening 220 to expose portions of the first pad portion 211 and the opening branches 2120A-2120D and the opening region 2120E. In the embodiment, the other end of each of the opening branches 2120A, 2120B, 2120C and 2120D at the pseudo edges can be aligned with the outmost edge of the first pad portion 211. In other words, the opening branches 2120A, 2120B, 2120C and 2120D are not closed and divide the first pad portion 211 into four portions. In one embodiment, the four portions can have the same areas or different areas. In the embodiment, similar to the description in the embodiment shown in FIG. 2A, the area A1 of the first pad portion 211 is the sum of the areas of the four portions. The area A2 of the opening 2120 is the sum of the areas of the opening branches 2120A-2120D and the opening region 2120E. The total area A3 is the sum of the area A1 of the first pad portion 211 and the area A2 of the opening 2120. A ratio of the area A2 of the opening 2120 to the total area A3 is substantially between 1% and 80%. In one embodiment, the ratio of the area A2 of the opening 2120 to the total area A3 is between 10 and 40%.

Figure 3C:
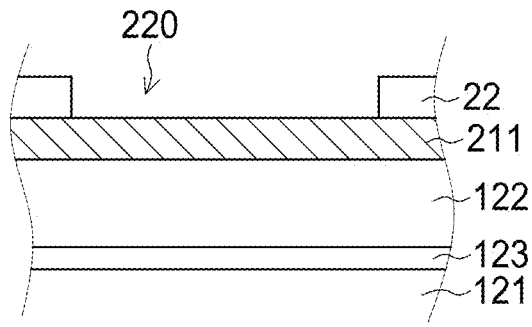

As shown in FIG. 2D, the opening 2120 formed in the first pad portion 211 includes opening branches 2120A, 2120B and 2120C to expose the surface of the second semiconductor layer 122 (not shown). Each of the opening branches 2120A, 2120B and 2120C is elongated. In a top view, one end of each of the opening branches 2120A, 2120B and 2120C points to a center of the opening 220 and/or a center of the composed shape of the first pad portion 211 and the opening 2120 respectively, but does not join with others. In other words, the opening branches 2120A, 2120B and 2120C extend from the outmost edge of the first pad portion 211 toward the center of the opening 220 and/or the center of the composed shape of the first pad portion 211 and the opening 2120 respectively. In one embodiment, each of the opening branches 2120A, 2120B and 2120C does not point to the center of the opening 220 and/or the center of the composed shape of the first pad portion 211 and the opening 2120. In one embodiment, each of the opening branches 2120A, 2120B and 2120C has a width d respectively. The widths d of the opening branches 2120A, 2120B and 2120C are the same or different. Each width d is smaller than or equal to 10 μm. In one embodiment, the opening branches 2120A, 2120B and 2120C are symmetrically distributed and arranged in the first pad portion 211. The enlarged cross sectional view of the first pad portion 211, the transparent conductive layer 22, the opening 2120 and the opening 220 taken along line F-F' of FIG. 2D is shown in FIG. 3C. As shown in FIG. 2D, the transparent conductive layer 22 covers a portion of the first pad portion 211, fills into the opening branches 2120A, 2120B and/or 2120C, and has an opening 220 to expose portions of the first pad portion 211 and the opening branches 2120A-2120C. In the embodiment, the other end of each of the opening branches 2120A, 2120B and 2120C at the pseudo edges can be aligned with the outmost edge of the first pad portion 211. In the embodiment, the area A2 of the opening 2120 is the sum of the areas of the opening branches 2120A, 2120B and 2120C. The total area A3 is defined by a contour composed by the outmost edges of the first pad portion 211 and the pseudo edges of the opening 2120 extending from one of the outmost edges and connecting to adjacent one of the outmost edges of the first pad portion 211. The contour of the first pad portion 211 and the opening 2120 is the composed shape. In other words, the total area A3 is the sum of the area A1 of the first pad portion 211 and the area A2 of the opening 2120. A ratio of the area A2 of the opening 2120 to the total area A3 is substantially between 1% and 80%. In one embodiment, the ratio of the area A2 of the opening 2120 to the total area A3 is between 10 and 40%.

Figure 3D:
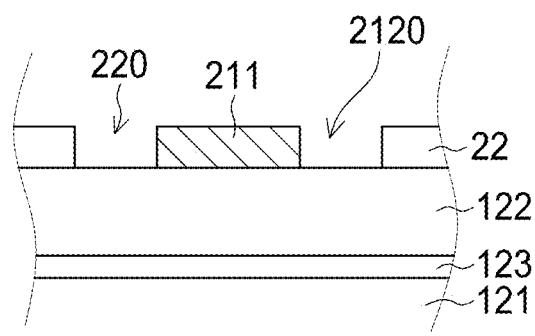

As shown in FIG. 2E, the opening 2120 formed in the first pad portion 211 includes opening branches 2120A, 2120B, 2120C and 2120D to expose the surface of the second semiconductor layer 122 (not shown). Each of the opening branches 2120A, 2120B, 2120C and 2120D is elongated. In a top view, one end of each of the opening branches 2120A, 2120B 2120C and 2120D points to a center of the opening 220 and/or a center of the composed shape of the first pad portion 211 and the opening 2120 respectively, but does not join with others. In other words, the opening branches 2120A, 2120B, 2120C and 2120D extend from the outmost edge of the first pad portion 211 toward the center of the opening 220 and/or the center of the composed shape of the first pad portion 211 respectively. In one embodiment, each of the opening branches 2120A, 2120B, 2120C and 2120D does not point to the center of the opening 220 and/or the center of the composed shape of the first pad portion 211 and the opening 2120. In one embodiment, each of the opening branches 2120A, 2120B, 2120C, 2120D has a width d respectively. The widths d of the opening branches 2120A, 2120B, 2120C and 2120D are the same or different. Each width d is smaller than or equal to 10 μm. In one embodiment, the opening branches 2120A, 2120B, 2120C and 2120D are symmetrically distributed and arranged in the first pad portion 211. The enlarged cross sectional view of the first pad portion 211, the transparent conductive layer 22, the opening 2120 and the opening 220 taken along line G-G' of FIG. 2E is shown in FIG. 3D. As shown in FIG. 2E, the transparent conductive layer 22 covers a portion of the first pad portion 211, fills into the opening branches 2120A, 2120B, 2120C and/or 2120D, and has an opening 220 to expose portions of the pad portion 211 and the opening branches 2120A-2120D. In the embodiment, the other end of each of the opening branches 2120A, 2120B, 2120C and 2120D at the pseudo edges can be aligned with the outmost edge of the first pad portion 211. In the embodiment, similar to the description in the embodiment shown in FIG. 2D, the area A2 of the opening 2120 is the sum of the areas of the opening branches 2120A, 2120B, 2120C and 2120D. The total area A3 is the sum of the area A1 of the first pad portion 211 and the area A2 of the opening 2120. A ratio of the area A2 of the opening 2120 to the total area A3 is substantially between 1% and 80%. In one embodiment, the ratio of the area A2 of the opening 2120 to the total area A3 is between 10 and 40%.

Figure 2G:
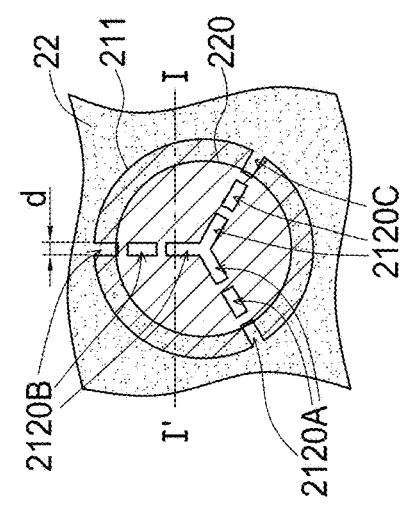
Figure 2F:
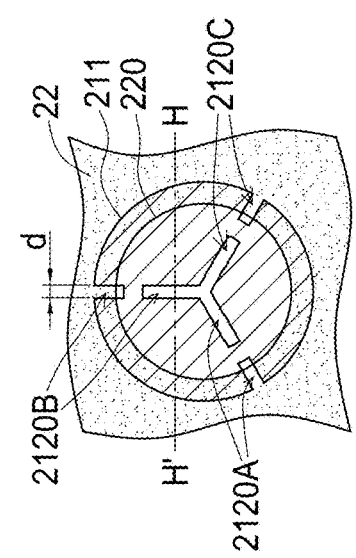

As shown in FIGS. 2F and 2G, the opening 2120 in the first pad portion 211 includes opening branches 2120A, 2120B and 2120C to expose the surface of the second semiconductor layer 122 (not shown). Each of the opening branches 2120A, 2120B and 2120C is elongated. One end of each of the opening branches 2120A, 2120B and 2120C joins at a center of the opening 220 and/or a center of the composed shape of the first pad portion 211 and opening 2120 with others and the opening branches 2120A, 2120B and 2120C extend from the ends toward the outmost edge of the first pad portion 211 respectively. As shown in FIG. 2F or 2G, each of the opening branches 2120A, 2120B and 2120C includes multiple sections, such as two sections shown in FIG. 2F, three sections shown in FIG. 2G or more sections (not shown), wherein the multiple sections are separated from each other. In one embodiment, each of the opening branches 2120A, 2120B and 2120C has a width d respectively. The widths d of the opening branches 2120A, 2120B and 2120C are the same or different. Each width d is smaller than or equal to 10 μm. The enlarged cross sectional views of the first pad portion 211, the transparent conductive layer 22, the opening 2120 and the opening 220 taken along line H-H' of FIG. 2F and line I-I' of FIG. 2G are shown in FIG. 3A. The transparent conductive layer 22 covers a portion of the first pad portion 211, fills into the opening branches 2120A, 2120B and/or 2120C. The transparent conductive layer 22 has an opening 220 to expose portions of the pad portion 211 and the opening branches 2120A-2120C. In the embodiment, the other end of each of the opening branches 2120A, 2120B and 2120C at the pseudo edges can substantially be aligned with the outmost edge of the first pad portion 211. In one embodiment, the widths of the multiple sections in each opening branches are the same or different. In one embodiment, the multiple sections in each opening branch have grading widths. The grading widths of the multiple sections are changed according to an extending direction of each of the opening branches 2120A, 2120B and 2120C. In the embodiment, similar to the description in the embodiment shown in FIG. 2D, the area A2 of the opening 2120 is the sum of the areas of the opening branches 2120A, 2120B and 2120C. The total area A3 is the sum of the area A1 of the first pad portion 211 and the area A2 of the opening 2120. A ratio of the area A2 of the opening 2120 to the total area A3 is substantially between 1% and 80%. In one embodiment, the ratio of the area A2 of the opening 2120 to the total area A3 is between 10 and 40%.

Figure 3E:
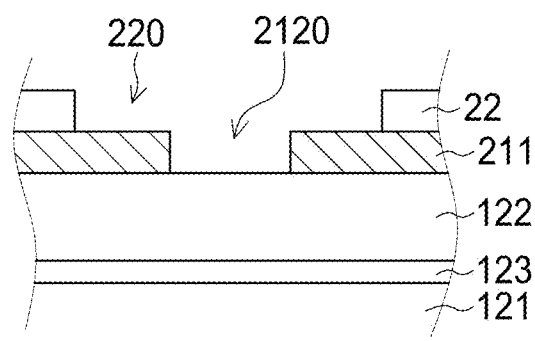

As shown in FIG. 2H, the opening 2120 formed in the first pad portion 211 includes opening branches 2120A, 2120B 2120C and 2120D. Each of the opening branches 2120A, 2120B 20210C and 2120D has a width d respectively. The widths d of opening branches 2120A, 2120B, 2120C and 2120D are the same or different. Each width d is smaller than or equal to 10 μm. The first pad portion 211 includes four portions separated by the opening branches 2120A, 2120B 2120C and 2120D. A contour composed by the outmost edges of the four portions of the first pad portion 211 and pseudo edges of the opening branches 2120A, 2120B 2120C and 2120D extending from the outmost edges of the four portions of the first pad portion 211 includes a composed shape. The composed shape can be a rectangle-like shape. Herein, the shape resulting from the attempt to form a rectangle is referred to as a "rectangle-like", for example a rectangular shape or a rectangle with curve corners. In one embodiment, the opening branches 2120A, 2120B 2120C and 2120D symmetrically formed along diagonal lines of the pad portion 211 to expose the surface of the second semiconductor layer 122 (not shown). In one embodiment, opening branches extend along middle lines of the outmost edges of the first pad portion 211 respectively. In a top view, one end of each of the opening branches 2120A, 2120B 2120C and 2120D joins with others at a center of the opening 220 and/or a center of the composed shape of the first pad portion 211 and the opening 2120. The enlarged cross sectional view of the first pad portion 211, the transparent conductive layer 22, the opening 2120 and the opening 220 taken along line J-J' of FIG. 2H is shown in FIG. 3E. As shown in FIG. 2H, the transparent conductive layer 22 covers a portion of the first pad portion 211, fills into the opening branches 2120A, 2120B 2120C and/or 2120D and has an opening 220 to expose portions of the pad portion 211 and the opening branches 2120A-2120D. In the embodiment, the other end of each of the opening branches 2120A, 2120B 2020C and 2120D at the pseudo edges can be aligned with the outmost edge of the first pad portion 211. In one embodiment, the four portions can have the same area or different area. In the embodiment, similar to the description in the embodiment shown in FIG. 2A, the area A1 of the first pad portion 211 is the sum of the areas of the four portions. The area A2 of the opening 2120 is the sum of the areas of the opening branches 2120A, 2120B, 2120C and 2120D. The total area A3 is the sum of the area A1 of the first pad portion 211 and the area A2 of the opening 2120. A ratio of the area A2 of the opening 2120 to the total area A3 is substantially between 1% and 80%. In one embodiment, the ratio of the area A2 of the opening 2120 to the total area A3 is between 10 and 40%.

Referring to FIG. 2H, although the shape of the opening 220 of the transparent conductive layer 22 is circular and the shape of the contour composed by outmost edges of the first pad portion 211 and pseudo edges of the opening branches 2120A, 2120B, 2120C and 2120D extending therefrom includes a composed shape, such as a rectangle-like shape, such as a rectangular shape or a rectangle with curve corners. In one embodiment, the design of the opening 2120 shown in FIGS. 2A-2G, such as opening branches, straight trench, opening branches with multiple sections, etc. can be adopted in the first pad portion 211 with a rectangle-like shape.

Figure 4:
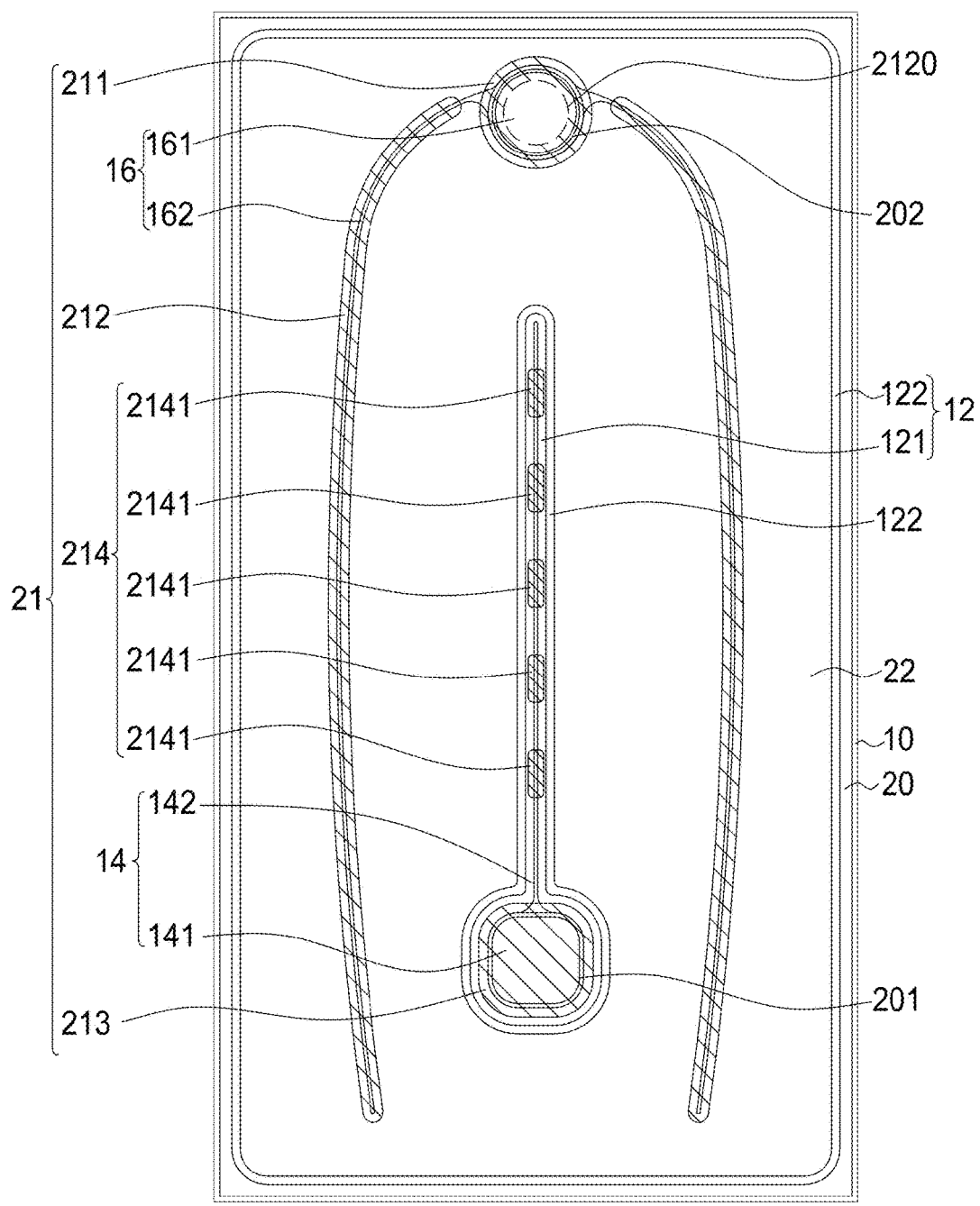
FIG. 4 shows a top view of an optoelectronic device in accordance with one embodiment of the present disclosure.

FIG. 4 shows a top view of an optoelectronic device 2 in accordance with one embodiment of the present disclosure. The structure and material of each layer in the optoelectronic device 2 is similar to those described in the optoelectronic device 1, and herein will not be described again. One of the differences between the optoelectronic device 2 and the optoelectronic device 1 shown in FIG. 1A is that the current blocking region 21 comprises a first pad portion 211 and a first finger portion 212, and the first pad portion 211 and the first finger portion 212 are separated from each other.

Figure 5:
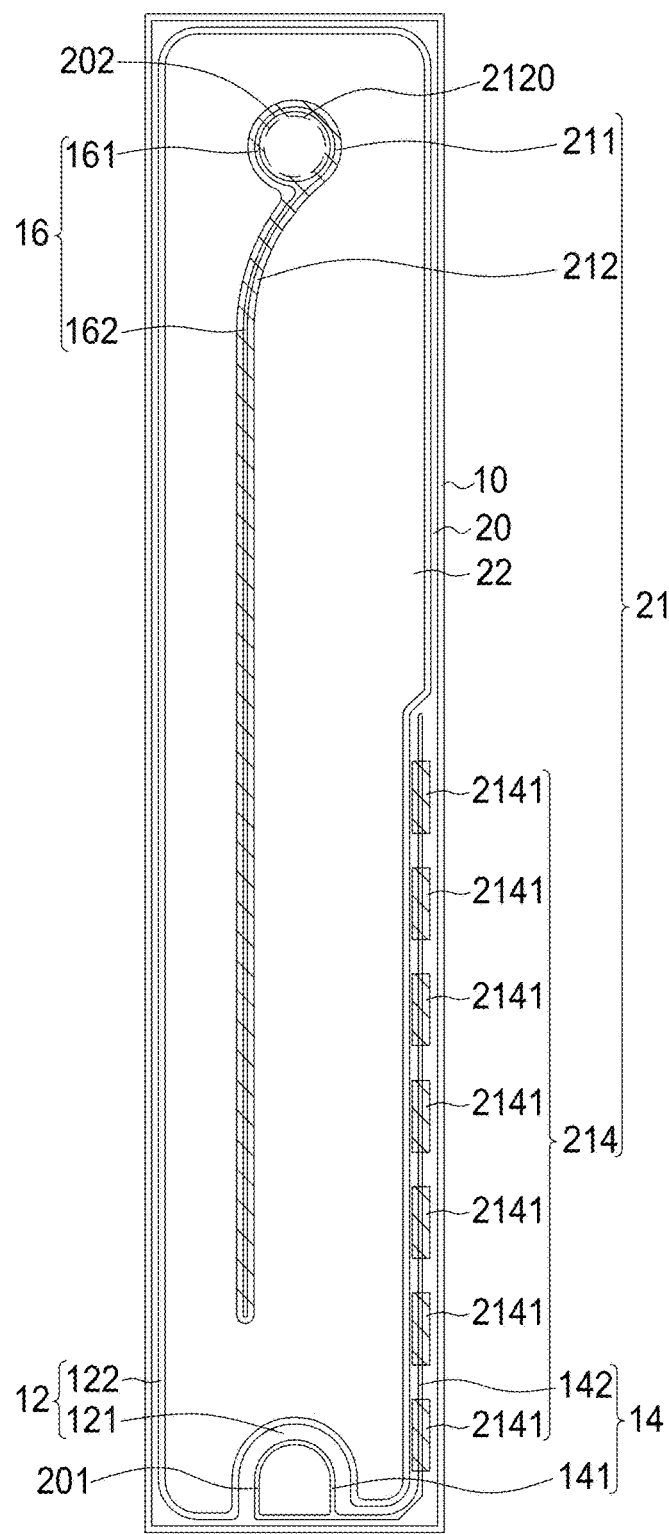
FIG. 5 shows a top view of an optoelectronic device in accordance with one embodiment of the present disclosure.

FIG. 5 shows a top view of an optoelectronic device 3 in accordance with one embodiment of the present disclosure. The structure of each layer in the optoelectronic device 3 is similar to those described in the optoelectronic device 1, and herein will not be described again. The differences between the optoelectronic device 3 and the optoelectronic device 1 are the layouts of the first electrode 16, the second electrode 14 and the current blocking region 211 which is formed under and correspond to the first electrode 16 and the second electrode 14. The second electrode 14 includes a second pad electrode 141 and a second finger electrodes 142 extending therefrom. The second finger electrode 142 extends adjacent to a long edge of the optoelectronic device 3 and towards one shorter edge of the optoelectronic device 3 opposite to the second pad electrode 141. The first electrode 16 includes a first pad electrode 161 and one first finger electrode 162 extending therefrom. The first finger 162 extends along a direction towards another shorter edge of the optoelectronic device 3 opposite to the first pad electrode 161 and parallel to the longer edge of the optoelectronic device 3. The current blocking region 211 is correspondingly formed under the first electrode 16 and the second electrode 14 and includes a first pad portion 211 and a first finger portion 212 under the first electrode 16 and a second finger portion 214 under the second electrode 14. In the embodiment, the designs and layouts of the first pad portion 211, the transparent conductive layer 22, the opening 2120 and the opening 220 of the optoelectronic device 3 are similar to those of the embodiment shown in FIG. 1C. Based on the same chip size, shape and structure of the optoelectronic device 3, an optoelectronic device with the design and layout of the first pad portion 211 and the opening 2120 of the embodiment shown in FIG. 2C, and an optoelectronic device including a first pad portion 211 without any opening are chosen to compare with the optoelectronic device 3. The three optoelectronic devices are turned on at 20 mA and their performance are compared.

Figure 6:
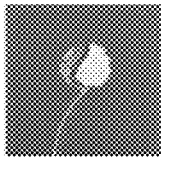
FIG. 6 shows a table with test data of two optoelectronic devices in accordance with embodiments of the present application and an optoelectronic device of a comparative example.
Figure 6:
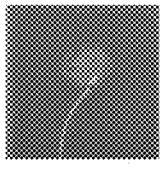
Figure 6:
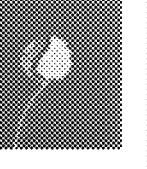
Figure 6:
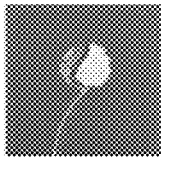
Figure 6:
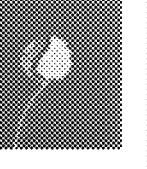
Figure 6:
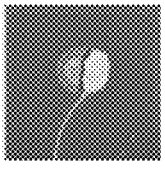

Referring to a table shown in FIG. 6, the table respectively lists the optical output power (Po), the operating voltage (Vf) and the peeling test results of the optoelectronic device 3 with the first pad portion 211 and the opening 2120 according to the embodiment shown in FIG. 1C, the optoelectronic device with the first pad portion 211 and the opening 2120 according to the embodiment shown in FIG. 2C, and the optoelectronic device with a first pad portion without any opening, which is the comparative example. All of the optoelectronic devices have the same size in 225 μm×143 μm. The shapes and most of the structures of the optoelectronic devices are similar. The differences of the three optoelectronic devices are the first pad portion and the opening 2120. The optoelectronic device labeled as "Type I" includes the first pad portion 211 without any opening which is the comparative example. The optoelectronic device labeled as "Type II" includes the first pad portion 211 with a circular opening. The optoelectronic device labeled as "Type III" includes the first pad portion 211 with four opening branches 2120A-2120D and the opening region 2120E. In the optoelectronic device of Type I, the first pad portion 211 does not have any opening, so the ratio of the area A2 of the opening to the total area A3 is zero. In the optoelectronic device of Type II, the ratio of the area A2 of the opening 2120 to the total area A3 is 38.6%. In the optoelectronic device of type III, the ratio of the area A2 of the opening 2120 to the total area A3 is 19.6%. The operating voltage of the optoelectronic device of Type II is lower than that of Type I or Type II. The power of the optoelectronic device of Type I is higher than that of Type II or Type III. In the average level, the operating voltages and the powers of the optoelectronic devices of Type I, II and III are similar. However in the peeling test, the optoelectronic devices of Type II and Type III can pass the peeling tests, but the optoelectronic device of Type I does not pass the peeling test. From the OM (Optical microscope) images, the residues of the first pad electrode 161 are observed in the first pad portions 211 of the optoelectronic devices of Type II and Type III. The residue is more than 50% of the area of the first pad electrode 161. So the first pad portions 211 of the optoelectronic devices of Type II and Type III benefit the adhesion of the first pad electrode 161 and prevent the first pad electrode 161 from peeling off the optoelectronic device. The areas of the opening 2120 affects the reliability of the optoelectronic device. The area of the first pad portion 211 affects the operating voltage and brightness. The ratio of the area A2 of the opening 2120 to the total area A3 between 1% and 80% can satisfy the requests of the operating voltage and brightness, and enhance the reliability of the optoelectronic device.

Figure 7:
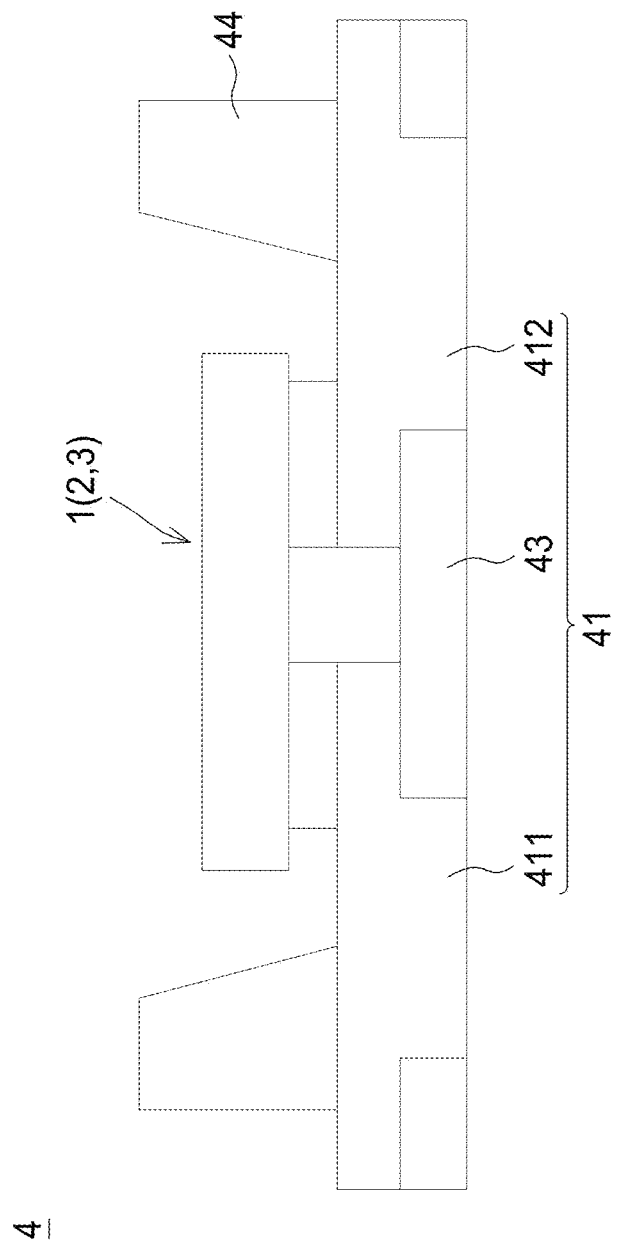
FIG. 7 shows an optoelectronic apparatus in accordance with an embodiment of the present disclosure.

FIG. 7 shows an optoelectronic apparatus 4 in accordance with an embodiment of the present invention. Any of the optoelectronic devices 1, 2 or 3 in the aforementioned embodiments is mounted on the first conductive pad 411 and the second conductive pad 412 of the carrier 41. The first conductive pad 411 and the second conductive pad 412 are electrically insulated with each other by an insulating part 43 composed of an insulating material. The optoelectronic device is flipped mounted on the carrier 41. The surface of the growth substrate which is opposite to the first electrode 16 and the second electrode 14 is faced up and functions as a light extraction surface. In order to increase the light extraction efficiency of the optoelectronic apparatus 4, a reflective structure 44 is disposed around the optoelectronic device.

Figure 8:
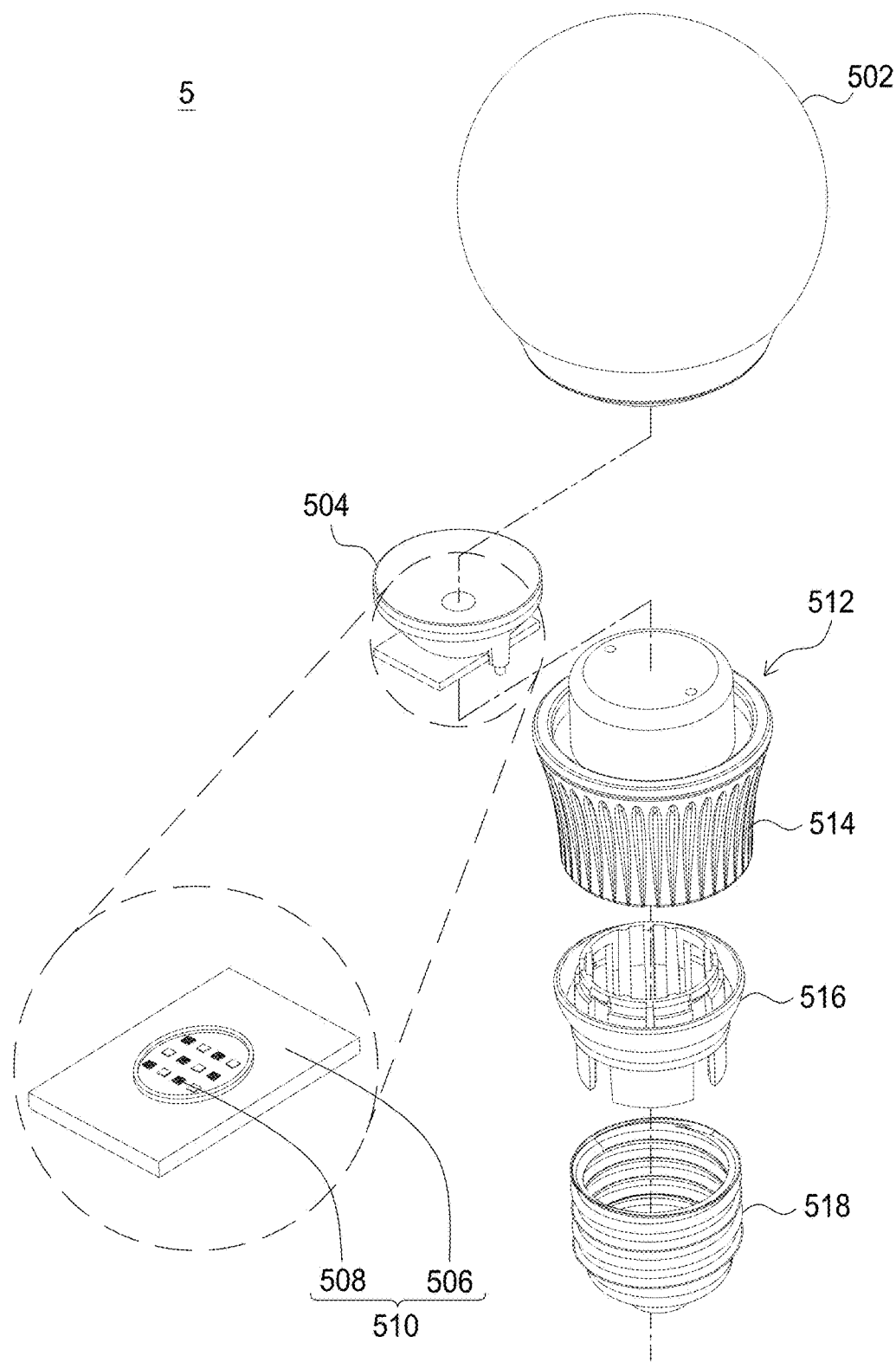
FIG. 8 shows an optoelectronic apparatus in accordance with an embodiment of the present disclosure.

FIG. 8 shows an optoelectronic apparatus 5 in accordance with an embodiment of the present invention. The optoelectronic apparatus 5 is a light bulb including a cover 502, a reflector 504, a light-emitting module 510, a lamp holder 512, a heat sink 514, a connecting portion 516, and an electrical connecting element 518. The light-emitting module 510 includes a carrier part 506 and a plurality of optoelectronic units 508 disposed on the carrier part 506. The plurality of optoelectronic units 508 can be any of the optoelectronic devices or the optoelectronic apparatus 4 in the aforementioned embodiments.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. An optoelectronic device, comprising:
a substrate;
a semiconductor stack, formed on the substrate;
a current blocking region, formed above the semiconductor stack and comprising a first pad portion and a first finger portion;
a first opening, formed in the first pad portion, wherein in a top view, the first opening comprises elongated shape defined by the first pad portion;
a transparent conductive layer formed on the current blocking region and/or a surface of the semiconductor stack; and
a first electrode formed above the current blocking region;
wherein the transparent conductive layer comprises a second opening to expose the first opening, and the first electrode electrically connects the semiconductor stack through the first opening and the second opening.

2. The optoelectronic device according to claim 1, wherein the first pad portion comprises an outmost edge and the first opening comprises an end aligned with the outmost edge.

3. The optoelectronic device according to claim 1, wherein a contour composed by an outmost edge of the first pad portion and a pseudo edge of the first opening includes a composed shape, the first opening comprises a straight trench passing through a center of the composed shape.

4. The optoelectronic device according to claim 1, wherein the first opening comprises a plurality of opening branches, wherein a contour composed by an outmost edge of the first pad portion and a pseudo edge of the first opening includes a composed shape.

5. The optoelectronic device according to claim 4, wherein the plurality of opening branches is symmetrically distributed and arranged in the first pad portion.

6. The optoelectronic device according to claim 4, wherein one of the plurality of opening branches comprises an end pointing to a center of the composed shape.

7. The optoelectronic device according to claim 4, wherein the first opening further comprises an opening region at a center of the composed shape.

8. The optoelectronic device according to claim 7, wherein one of the plurality of opening branches connects the opening region.

9. The optoelectronic device according to claim 4, wherein one of the plurality of opening branches comprises multiple sections separated from each other.

10. The optoelectronic device according to claim 9, wherein the one of the plurality of opening branches comprises an extending direction toward a center of the composed shape, and the multiple sections comprise grading widths changed along the extending direction.

11. The optoelectronic device according to claim 4, wherein each of the plurality of opening branches comprises a width respectively, and the widths are different.

12. The optoelectronic device according to claim 1, wherein, in a top view, the first opening comprises a first shape, the first electrode comprises a second shape, and the first shape is different from the second shape.

13. The optoelectronic device according to claim 1, wherein the first pad portion and the first finger portion are separated from each other.

14. The optoelectronic device according to claim 1, wherein the transparent conductive layer covers the first pad portion and fills into the first opening.

15. The optoelectronic device according to claim 1, wherein the second opening comprises a periphery, the first pad portion comprises an outmost edge and the periphery of the second opening is spaced apart from the outmost edge of the first pad portion.

16. The optoelectronic device according to claim 1, further comprising a second electrode wherein the second electrode comprises a second pad electrode and a second finger electrode.

17. The optoelectronic device according to claim 16, wherein the current blocking region further comprises a second pad portion and a second finger portion, and the second finger portion comprises a plurality of separated islands under the second finger electrode.

18. The optoelectronic device according to claim 1, wherein the first opening comprises a first area, the first pad portion and the first opening comprises a total area, and a ratio of the first area to the total area is substantially between 1% and 80%.

* * * * *